(12) United States Patent
Girod

(10) Patent No.: US 6,211,801 B1
(45) Date of Patent: Apr. 3, 2001

(54) DATA COMMUNICATION ARRANGEMENT HAVING VARIABLE LENGTH CODING AND METHOD THEREFOR

(75) Inventor: Bernd Girod, Spardorf (DE)

(73) Assignee: Netergy Networks, Santa Clara, CA (US)

( * ) Notice: Subject to any disclaimer, the term of this patent is extended or adjusted under 35 U.S.C. 154(b) by 0 days.

(21) Appl. No.: 09/062,163

(22) Filed: Apr. 17, 1998

(51) Int. Cl.[7] ............................. H03M 7/40; H03M 7/00
(52) U.S. Cl. ................................. 341/67; 341/81
(58) Field of Search ..................... 341/67, 65, 82, 341/81; 348/416, 384, 565; 709/219; 326/38

(56) References Cited

U.S. PATENT DOCUMENTS 5,654,704 * 8/1997 Tayama ................................. 341/67
5,852,469 * 12/1998 Nagai et al. ........................ 341/67 X
5,883,589 * 3/1999 Takishima et al. ..................... 341/67

OTHER PUBLICATIONS

Cheung, "Quantization Error in Ternary Delta Modulation Schemes," IEEE, 1990.*
Panchanathan et al, "A Systolic Array Architecture for Image Coding Using Adaptice Vector Quantization," IEEE, 1991.*

* cited by examiner

Primary Examiner—Patrick Wamsley
(74) Attorney, Agent, or Firm—Crawford PLLC

(57) ABSTRACT

A variable length coding system encodes and decodes symbols as uniquely decodable code words using an assignment scheme having a maximum code word length. According to one embodiment, a first bitstream is combined with a second bitstream to provide a resultant bitstream to be sent over a communications channel. The first bitstream represents the code words in a forward direction, and the second bitstream contains the same code words reversed and bit delayed by at least the maximum code word length. A resultant bitstream can be decoded in forward or reverse direction. The scheme is highly efficient for long blocks of data and the reversible aspect of the coding scheme improves the tolerance for errors caused by channel interference.

21 Claims, 3 Drawing Sheets

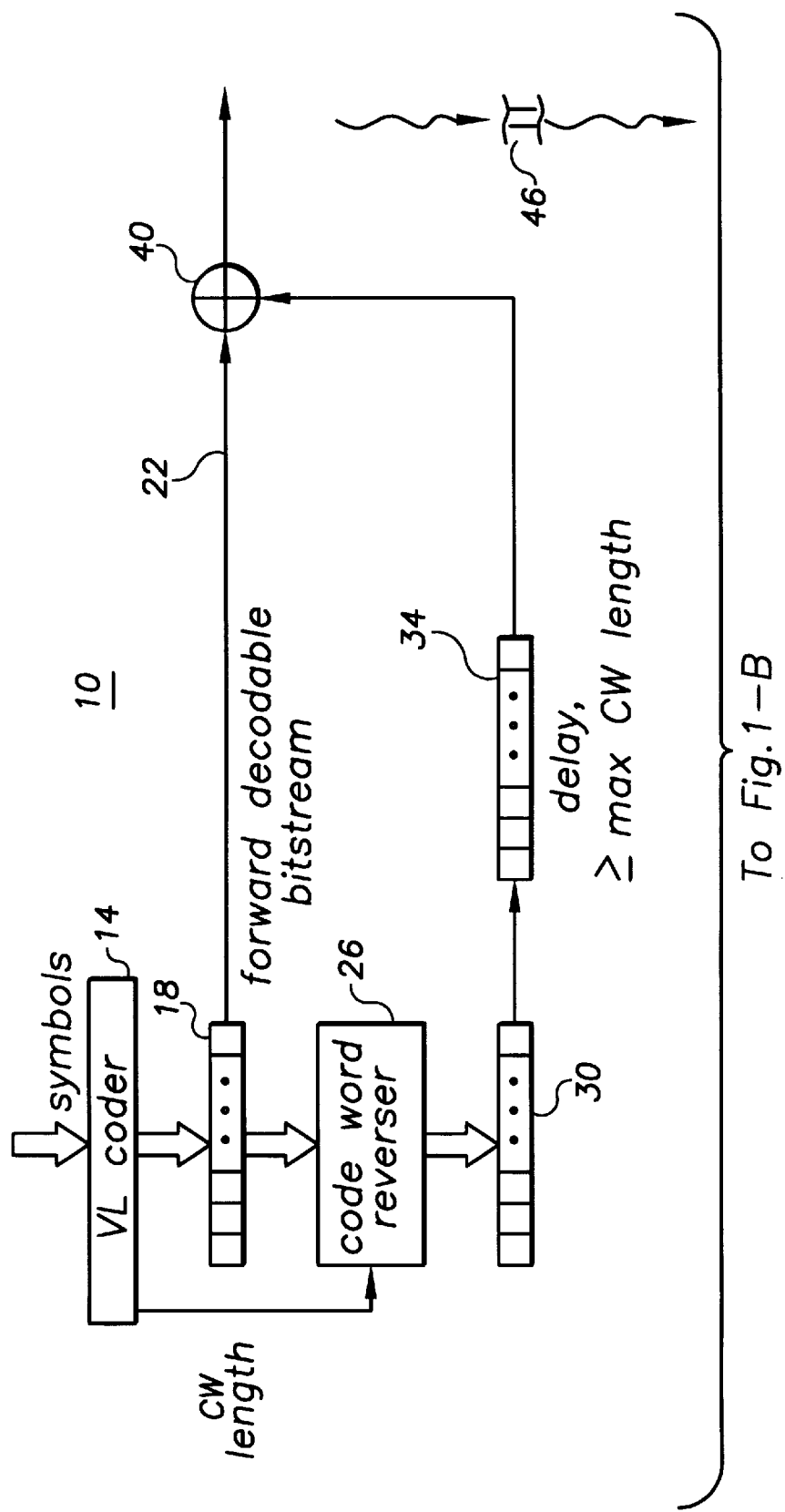
FIG.1-A

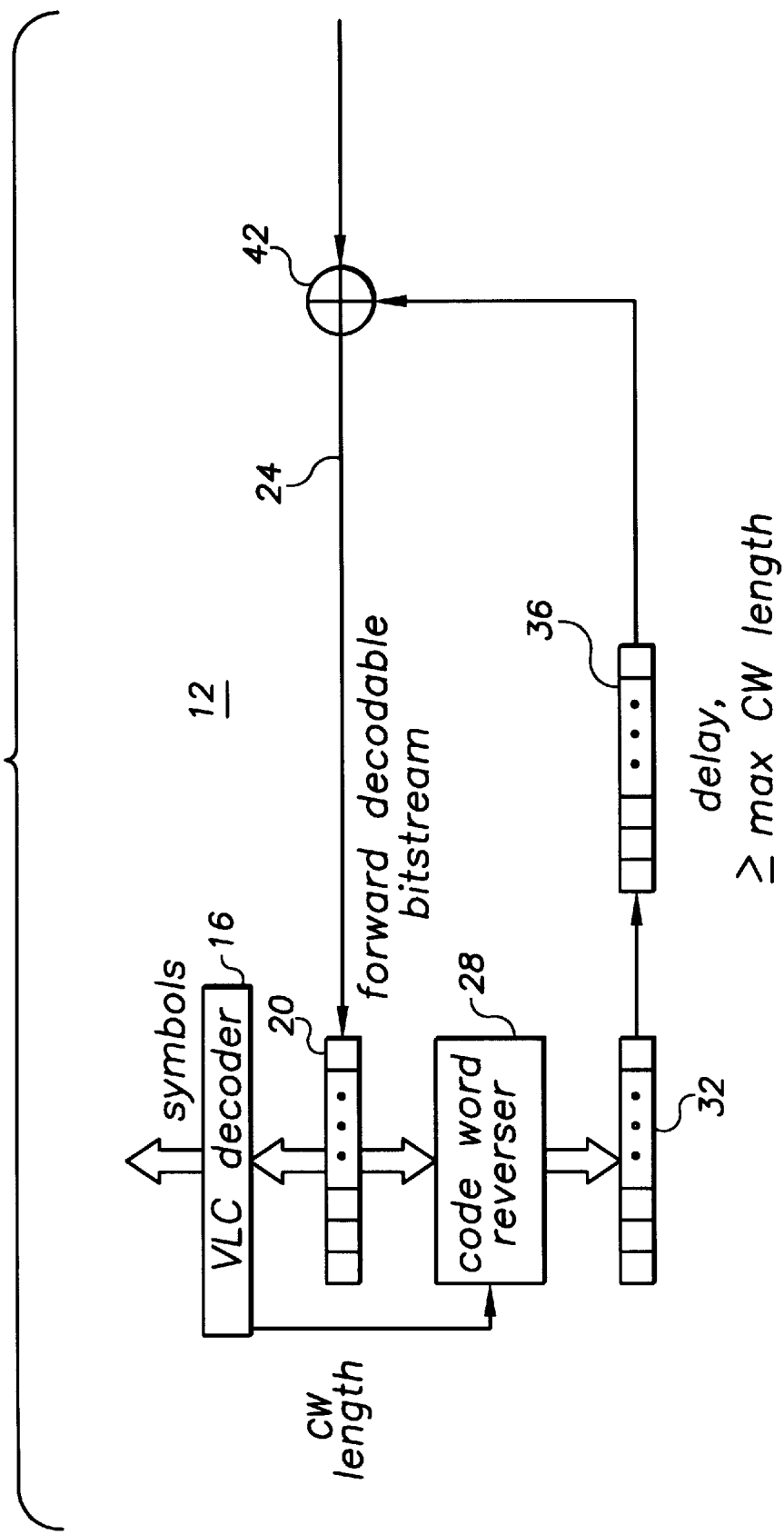
FIG.1-B

DATA COMMUNICATION ARRANGEMENT HAVING VARIABLE LENGTH CODING AND METHOD THEREFOR

FIELD OF THE INVENTION

The present invention relates generally to communication systems, and particularly to communication arrangements and methods benefiting from variable length coding.

BACKGROUND OF THE INVENTION

The widespread use of digital processing technology has found its way into a variety of equipment and, in some form, into most industries. In many applications, digital processing technology involves the communication of information in coded form. The information to be sent is first translated to a set of code words and then the information is sent as a sequence of code words over a communications channel for decoding at another terminal.

For effective use of the communications channel, selection of the correct coding scheme can be particularly important. Some coding schemes can be implemented using a relatively small amount of data information and, in many instances, permit effective data compression. For communication environments that are susceptible to various types of interference, however, many seemingly efficient data coding schemes become intolerable. For instance, in a data coding scheme involving synchronization of data bits between the transmitting and receiving terminals, interference such as noise can result in loss of synchronization and require retransmission of the data. The retransmission frustrates the object of being an efficient data coding scheme.

There have been many attempts to develop an efficient data coding scheme that permits some degree of interference without requiring retransmission. Many of these efforts concern variable length coding. Variable length coding, as the name suggests, involves assigning code words of different lengths to the symbols to be transmitted. This type of coding is founded on the observation that space can be saved if the short code words are assigned to the most commonly used symbols. An early example of this coding type is the Morse code, where more frequently-used English letters are assigned a short representation (e.g., e="·") and less frequently-used letters are assigned a longer representation (e.g., p="·- -·").

Another example of variable length coding is the Huffman algorithm. The Huffman algorithm takes into account the probability of each symbol and then assigns variable length codes to them in a manner that minimizes the average code word length. The Huffman code words are all variable length strings of ones and zeros, with the underlying rule that no code word for one symbol is a prefix for the code word of another symbol. Accordingly, variable length coding schemes are designed so that the symbols can be uniquely decoded symbol by symbol, by parsing the concatenation of prefix code words in the forward direction.

The International Telecommunications Union (ITU) recently adopted a reverse variable length coding (RLVC) scheme for use in the H.263+ video compression standard. Reverse variable length coding refers to variable length codes that can be uniquely decoded in two directions. An advantage of decoding from both ends of the transmission sequence is the ability to increase tolerance for errors. A bit error in the middle of the sequence, for example, might prevent decoding beyond the point of the error. Using a RVLC scheme, however, the sequence can be decoded from one end up to the point of the error and then from the other end up to the point of the error. By decoding in this manner, RVLCs increase the tolerance of transmission interference, thereby decreasing the need for retransmission and extensive error-correcting algorithms.

The potential applications for reverse and conventional variable length coding schemes are diverse and, for many applications, it is important to maintain a relatively high degree of tolerance for transmission interference and to minimize the size (e.g., bit length) of the codes for efficiency. Tolerance for transmission interference is typically increased by adding verification or error-correcting data to the transmission sequence. A decoder at the receiving end then uses this added data for integrity verification or for error correction. Unfortunately, these two objectives are inconsistent. By adding the verification or error-correcting data to increase tolerance for transmission errors, the effective size of the codes transmitted is increased rather than minimized.

SUMMARY OF THE INVENTION

The present invention is directed to methods and arrangements of variable length coding for use in data communication applications.

One particular embodiment of the present invention is directed to an arrangement for coding and decoding data representing symbols as uniquely decodable code words having a maximum code word length. The arrangement provides for variable length coding in a Huffman decoder, such as the one referred to above. This arrangement is advantageous in that it permits highly efficient communication for relatively long blocks of data. The arrangement also provides for reverse variable length coding, in which the encoded symbols can be decoded in two directions.

Another particular embodiment of the present invention is a method of communicating data representing symbols as uniquely decodable code words having a maximum code word length. The method involves using a resultant bitstream over a communications channel to communicate the symbols, with the resultant bitstream provided by EXORing a first bitstream and a second bitstream. The first bitstream represents the sequence of symbols by a sequence of prefix code words and the second bitstream represents the same sequence of symbols by a sequence of suffix code words, delayed at least by the maximum code word length.

Other aspects of the present invention concern arrangements for implementing methods of communicating data in manners consistent with the above characterization.

The above summary of the invention is not intended to describe each disclosed embodiment of the present invention. An overview of other example aspects and implementations will be recognizable from the figures and of the detailed description that follows.

BRIEF DESCRIPTION OF THE DRAWINGS

Various aspects and advantages of the present invention will become apparent upon reading the following detailed description and upon reference to the drawings in which:

FIG. 1 is a block diagram of a data-communication arrangement, according to a particular example embodiment of the present invention.

Figure 2:
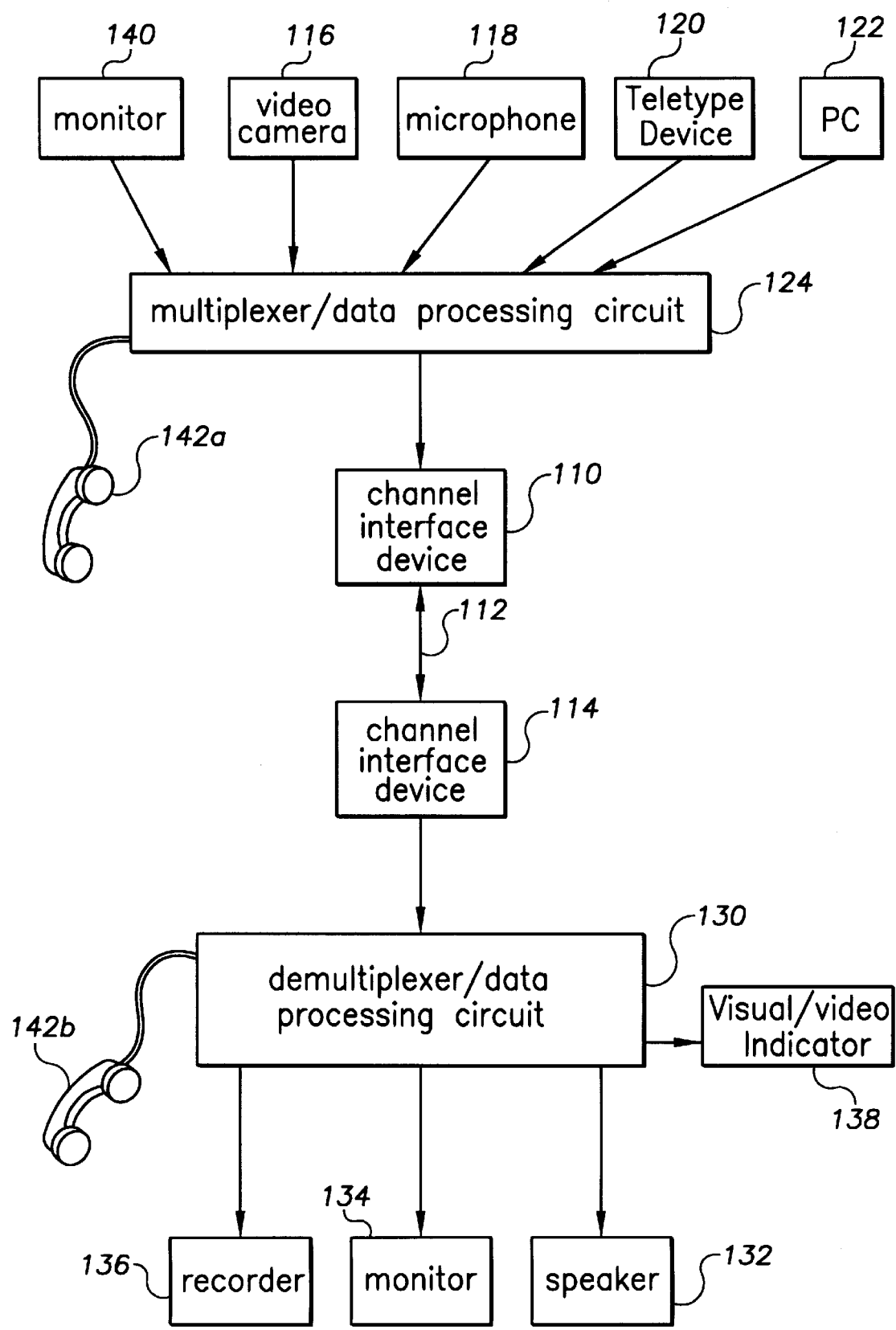
FIG. 2 is a block diagram of a video-conferencing system, according to a particular embodiment and application of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is applicable to a variety of data-communication applications and has been found to be particularly advantageous in communication applications, such as video-conferencing applications, requiring or benefiting from one-way or two-way (reverse) variable length coding. An appreciation of various aspects of the invention is best gained through a discussion of various application examples operating in such an environment.

According to one example embodiment of the present invention, symbols are represented as uniquely decodable code words having a maximum code word length, and a resultant bitstream is transmitted and received over a communications channel to communicate the symbols. The resultant bitstream is provided by combining a first bitstream and a second bitstream. The first bitstream represents the symbols by a sequence of prefix code words and the second bitstream by a sequence of suffix code words of corresponding lengths. The second bitstream is bit-delayed at least by the maximum code word length. In this context, bit-delayed refers to being offset or shifted by a number of bits. Combining the first and second bitstreams can be accomplished using a number of conventional processing techniques. For example, when applying this coding/decoding approach to a digital system, the combining can be implemented using a simple logical EXOR functional block implemented, for instance, by a programmable processor and/or one or many discrete or semi-discrete circuit arrangements.

Turning now to the drawings, FIG. 1 illustrates an example arrangement for implementing data communication in accordance with the present invention. The arrangement is advantageous in that it can increase both the efficiency for many data communication applications and provide for an increased degree of tolerance for interference in the communication. According to one aspect of the present invention and as illustrated in FIG. 1, the arrangement includes an encoding circuit 10 and a decoding circuit 12. In some applications, the encoding and decoding circuits 10 and 12 can be respective portions of a transmitter and a receiver (not shown), for example, in the context of radio frequency technology such as point-to-point or telephony technology. In other applications, the encoding and decoding circuits 10 and 12 can be respective portions of intercoupled video-conferencing terminals, each terminal arranged with one or both of the encoding and decoding circuits 10 and 12 for communicating uni- or bi-directionally.

The encoding and decoding circuits 10 and 12 operate essentially in an inverse manner. A programmable lookup table, algorithmic processing circuit or discrete translation circuit (or any combination thereof) is used to translate from symbols to code words or from code words to symbols. This function is provided by the encoding circuit 10 as a variable length (VL) coder 14 and by the decoding circuit 12 as a variable length (VLC) decoder 16. Each of the encoding and decoding circuits 10 and 12 uses a code word register 18 or 20 for storing code words passing between the coder 12 or decoder 16 and a forward decodable bitstream path 22 or 24. Further, each of the encoding and decoding circuits 10 and 12 uses a code word reverser 26 or 28, a reverser output register 30 or 32, and a delay line circuit 34 or 36 coupled to an EXOR circuit 40 or 42. The EXOR circuits 40 and 42 are communicatively coupled through a communications channel 46.

The following example application of the present invention illustrates the operation of each of the above functional blocks. In this example, letters are encoded using a variable length code assignment as follows: the letter A is assigned the code 1, B is assigned 01, C is assigned 001 and D is assigned 000. Further, the example sequence to be encoded and decoded is C B D D A A.

The encoding operation is illustrated in Table I as follows (with bits being fed from left to right, and with spaces inserted between bits for better readability):

TABLE I

| Symbols To Be Sent | C B D D A A | Comments |
|---|---|---|
| Output from Register 18 | 001 01 000 000 1 1 000 | The last three bits (output from Register 18) are set to 000. |
| Output from Delay 34 | 000 100 10 000 000 1 1 | Initialization to 000, followed by reversed code words, delayed 3 bits. |
| Output from EXOR 40 | 0011101000011011 | These bits are sent over the communications channel. |

Using this code-assignment scheme, the first three bits of the delay register, and the last three bits out of the register 18 (or into the EXOR circuit 40), are set to 000. The delay register is set to a size that is equal to or greater than the maximum code word length for any code word of the set.

The decoding operation for the above-sent sequence of data is the inverse of the encoding operation. Table II illustrates the operation (with bits being received from left to right):

TABLE II

| Data Received | 0011101000011011 | Comments |
|---|---|---|
| Output from Delay 36 | 000 100 10 000 000 1 1 | Initialization to 000, followed by reversed code words delayed 3 bits. |
| Output from EXOR 42 | 001 01 000 000 1 1 0 0 0 | The last three bits equal 000 due to initialization. |
| Output from Decoder 16 | C B D D A A | These letters are uniquely decodable. |

The decoding operation can be performed from either end of the sequence and the same symbols are decoded. Being able to decode from both ends is advantageous in applications where the communications channel is susceptible to noise. If an error is found somewhere in the middle of the sequence, for example, the decoder 16 may not be able to recognize communicated code, decoding can be performed from both ends up to the point of the error thereby increasing the integrity of the communication. Further, some applications involve a long sequence of data being received with the knowledge that certain information in the sequence is near its end. Being able to decode from the end of the sequence alleviates the need to decode the majority of the sequence, thereby saving significant processing power and time.

Table III illustrates the decoding operation addressing the data sequence in reverse order:

TABLE III

| Data Received | 0011101000011011 | Comments |
|---|---|---|
| Sequence Reversed | 1101100001011100 | |
| Output from Delay 36 | 000 1 1 000 000 10 100 | Initialization to 000, followed by reversed code words, delayed 3 bits. |
| Output from EXOR 42 | 1 1 000 000 01 001 000 | The last three bits equal 000 due to initialization. |
| Output from Decoder 16 | AA  D  D  B  C | These bits are sent over the communications channel. |

The above-described implementations can be realized using any of a variety of designs. For example, the functional blocks of FIG. 1 can be implemented with circuits dedicated to providing functions described with the code word reverser 26 or 28 implemented using, for example, a processing circuit, a discrete translation circuit or a first-in, last-out buffer. In other implementations of the present invention, a plurality of the functional blocks depicted in the encoding and decoding circuits 10 and 12 are implemented using the same device or type of circuit. It will also be recognized that the order of the delay circuit and the reverser, in either the decoder or the encoder, can be switched without effecting the overall operation.

In a particular application thereof, a videoconferencing implementation of the present invention uses an industry-accepted video-communication protocol, for example, the ITU-T H.263 recommendation along with the functional blocks depicted in FIG. 1 to provide improvements in terms of video bandwidth and accuracy. One such videoconferencing implementation provides each of the above-described functions using a programmable video-processing circuit, an example of which includes a RISC type processor and a DSP type processor in videoconferencing products manufactured by the instant assignee. Such a programmable video-processing circuit, along with the products, are described through and in connection with U.S. patent application Ser. No. 09/005,053, entitled "Videocommunicating Apparatus And Method Therefor", now U.S. Pat. No. 6,124,882, issued Sep. 26, 2000. This application was filed on Jan. 9, 1998 (Docket No. 11611.51US01), assigned to the instant assignee and is incorporated herein by reference in its entirety.

FIG. 2 illustrates such a video processing system that may be implemented using the example arrangement and device types described and illustrated in connection with FIG. 1. The system of FIG. 2 includes data sending equipment depicted above a communication channel 112 of FIG. 2 and data receiving equipment depicted below the communication channel 112. While the sending and receiving of such data is often reciprocal in many data processing applications of this type as with the instant video-conferencing illustration, the configuration illustrated in FIG. 2 is simplified in this regard to facilitate the discussion.

At the sending end of the system of FIG. 2, a transmitting channel interface device 110 is used to send processed data over the communication channel 112 to a receiving channel interface device 114. The data that is presented to the channel interface device 110 is collected from various types of data sources including, for example, a video camera 116, a microphone 118, a teletype device 120, and a conventional personal computer 122. Examples of other sources, not shown in FIG. 2, from which such data can be collected include VCRs, digital still cameras, and IR keyboards. In one implementation, the video processor receives a block of data (such as a recorded movie from a VCR or a still view from a digital still camera) and annotates such input data with teletext for the hearing impaired viewer. Using the RVLC described above in connection with FIG. 1, the blocks of the video or the text can be decoded from either end of the sequence of information as discussed above.

The data sources typically use buffers to store the data to be collected. The data collected from each of these data sources is received by multiplexer/data processing equipment (MDPE) 124. The MDPE 124 collects and formats the data collected from each of the input sources for transmission over the channel 112. A monitor 140 is optionally used with the video camera 116 to monitor the manner in which the video camera 116 captures the video images.

At the lower end of the system of FIG. 2, the formatted data communicated over the channel 112 is received by the channel interface device 114, which then presents the received data to demultiplexer/data processing equipment (DDPE) 130. The DDPE 130 is set-up to sort out the formatted data received over the channel 112 according to instructions previously sent by the MDPE 124. The demultiplexed data is then presented to the appropriate output source equipment. This equipment processes, for example, audio data to a speaker 132, video data and teletype data for display at a monitor 134 (displaying the images and the data input by the user in closed-caption format), and transmitted conferencing call and teletype data for a recorder 136 (such as a printer, VCR or magnetic recording device or other media).

For further information concerning the above-described invention (and background concerning Huffman and other VLC coding/decoding schemes), reference may be made to the article entitled "Bidirectionally Decodable Streams of Prefix Code Words," by the inventor of record (Apr. 6, 1998), incorporated herein by reference.

The various embodiments described above are provided by way of illustration only and should not be construed to limit the invention. Those skilled in the art will recognize various modifications and changes that can be made to the present invention without strictly following the example embodiments and applications illustrated and described herein. For example, those skilled in the art will recognize the present invention as being applicable to coding systems other than binary systems (such as trinary systems), with "bits" referring to one of a plurality of positions used to represent the symbol. Such modifications and changes do not depart from the true spirit and scope of the present invention, which is set forth in the following claims.

What is claimed is:

1. For use in electronic communication arrangements, a method of representing symbols by a concatenation of variable length code words, comprising:

using a resultant bitstream to represent the symbols; the resultant bitstream provided by combining a first bitstream and a second bitstream, when using a common decoding device for decoding the first and second bitstreams the first bitstream being decodable in a forward direction and the second bitstream being decodable in a reverse direction and when bit-delayed at least by a selected bit length.

2. A method of representing symbols, according to claim 1, wherein the step of using includes transmission over a communications channel.

3. A method of representing symbols, according to claim 1, wherein the step of using includes storing on a digital storage medium.

4. A method of representing symbols, according to claim 1, wherein the step of combining includes bit-wise EXOR-ing.

5. A method of representing symbols, according to claim 1, wherein the first bitstream includes at least one prefix code word.

6. A method of representing symbols, according to claim 1, wherein the second bitstream includes at least one suffix code word.

7. A method of representing symbols, according to claim 1, wherein the first bitstream consists of prefix code words and the second bitstream consists of suffix code words.

8. For use in electronic communication arrangements, a method of representing symbols by a uniquely decodable concatenation of variable length code words having a maximum code word length, comprising:

combining a first bitstream and a second bitstream to provide a resultant bitstream, when using a common decoding device for decoding the first and second bitstreams the first bitstream being decodable in a forward direction and the second bitstream being decodable in a reverse direction and bit-delayed at least by code word length;

transmitting the resultant bitstream over a communications channel;

receiving the resultant bitstream; and decoding the resultant bitstream including combining the resultant bitstream with a third bitstream, when using a common decoding device for decoding the third and resultant bitstreams the third bitstream being decodable in a reverse direction relative to the resultant bitstream and bit-delayed at least by code word length.

9. A method of representing symbols, according to claim 8, wherein the first bitstream includes a set of leading or trailing bits for initialization.

10. A method of communicating data representing symbols, according to claim 8, wherein the step of decoding includes using a set of leading or trailing bits in the resultant bitstream for initialization.

11. An arrangement for communicating symbols represented as a concatenation of uniquely decodable code words having a maximum code word length, comprising:

means for providing a resultant bitstream by combining a first bitstream and a second bitstream, when using a common decoding device for decoding the first and second bitstreams the first bitstream being decodable in a forward direction and the second bitstream being decodable in a reverse direction and bit-delayed at least by the maximum code word length; and means for transmitting the resultant bitstream over a communications channel to communicate the symbols.

12. An arrangement for communicating data representing symbols as a concatenation of uniquely decodable code words having a maximum code word length, comprising:

a programmable data processor, including a program configured and arranged to cause the data processor to provide a resultant bitstream by combining a first bitstream and a second bitstream, when using a common decoding device for decoding the first and second bitstreams the first bitstream being decodable in a forward direction and the second bitstream being decodable in a reverse direction and bit-delayed at least by the maximum code word length; and communication means for communicating the resultant bitstream over a communications channel to communicate the symbols.

13. An arrangement for communicating data representing symbols as uniquely decodable code words having a maximum code word length, according to claim 12, wherein the communication means is a part of a transmitter.

14. An arrangement for communicating data representing symbols as uniquely decodable code words having a maximum code word length, according to claim 12, wherein the communication means is a part of a receiver.

15. A videoconferencing arrangement for communicating at least video data, with symbols represented as uniquely decodable code words having a maximum code word length, comprising:

a video camera for generating video data representing captured images;

a programmable data processor responsive to the video camera and including a program configured and arranged to cause the data processor to provide a resultant bitstream by combining a first bitstream and a second bitstream, each bitstream corresponding to a sequence of the generated video data, when using a common decoding device for decoding the first and second bitstreams the first bitstream being decodable in a forward direction and the second bitstream being decodable in a reverse direction and bit-delayed at least by the maximum code word length;

communication means for communicating the resultant bitstream over a communications channel to communicate the symbols; and means for decoding the resultant bitstream.

16. For use in electronic communication arrangements, a method of decoding symbols represented by a concatenation of variable length code words, comprising:

providing a resultant bitstream to represent the symbols; the resultant bitstream provided by combining a first bitstream and a second bitstream, when using a common decoding device for decoding the first and second bitstreams the first bitstream being decodable in a forward direction and the second bitstream being decodable in a reverse direction and bit-delayed at least by a selected bit length; and combining the resultant bitstream with a third bitstream, when using a common decoding device for decoding the third and resultant bitstreams the third bitstream being decodable in a reverse direction relative to the resultant bitstream and bit-delayed at least by a selected bit length.

17. A method of decoding symbols, according to claim 16, wherein combining includes processing the resultant bitstream in a reverse direction.

18. A method of decoding symbols, according to claim 16, wherein the selected bit length is a maximum code word length.

19. A method of decoding symbols, according to claim 16, wherein each bit represents a nonbinary symbol.

20. A method of decoding symbols, according to claim 16, wherein combining includes processing the resultant bitstream in a forward direction.

21. An arrangement for communicating data representing symbols as a concatenation of uniquely decodable code words having a maximum code word length, comprising:

a programmable data processing circuit configured and arranged to provide a resultant bitstream by combining a first bitstream and a second bitstream, the first and second bitstreams characterized in that, using a common decoding device the first bitstream is decodable in a forward direction and the second bitstream is decodable in a reverse direction and bit-delayed at least by the maximum code word length; and a data coupler adapted to communicate the resultant bitstream over a communications channel to communicate the symbols.

* * * * *